United States Patent [19]

Tanaka

[11] Patent Number: 5,654,528

[45] Date of Patent: Aug. 5, 1997

[54] FLEXIBLE PRINTED CIRCUIT

[75] Inventor: Kazuhisa Tanaka, Omiya, Japan

[73] Assignee: Fuji Photo Optical Co., Ltd., Japan

[21] Appl. No.: 560,932

[22] Filed: Nov. 20, 1995

[30] Foreign Application Priority Data

Nov. 24, 1994 [JP] Japan ................................. 6-289414

[51] Int. Cl.$^6$ ....................................................... H05K 1/02
[52] U.S. Cl. .......................... 174/266; 174/265; 174/254; 174/262
[58] Field of Search ........................ 174/266, 262, 174/255, 254, 250, 265; 361/749; 439/67, 77

[56] References Cited

U.S. PATENT DOCUMENTS 4,435,740 3/1984 Huckabee et al. .................. 361/398
4,923,406 5/1990 Bucknam .............................. 439/77
4,961,806 10/1990 Gerrie et al. ........................ 156/252

*Primary Examiner*—Laura Thomas
*Attorney, Agent, or Firm*—Sixbey, Friedman, Leedom & Ferguson, P.C.; David S. Safran

[57] ABSTRACT

A cover layer of a flexible printed circuit includes a first hole and a plurality of openings. The first hole has substantially the same diameter as that of a positioning piece of an inspection machine. A distance between the first hole and each of the openings is predetermined. After the cover layer is adhered to the base member, a second hole is formed on the base member inside the first hole. A diameter of the second hole is smaller than that of the first hole. At the time of a continuity test, the second hole is deformed by a insertion of the portioning piece, so that the positioning piece is inserted into the first hole. As a result, the flexible printed circuit is positioned on the basis of the first hole.

4 Claims, 3 Drawing Sheets

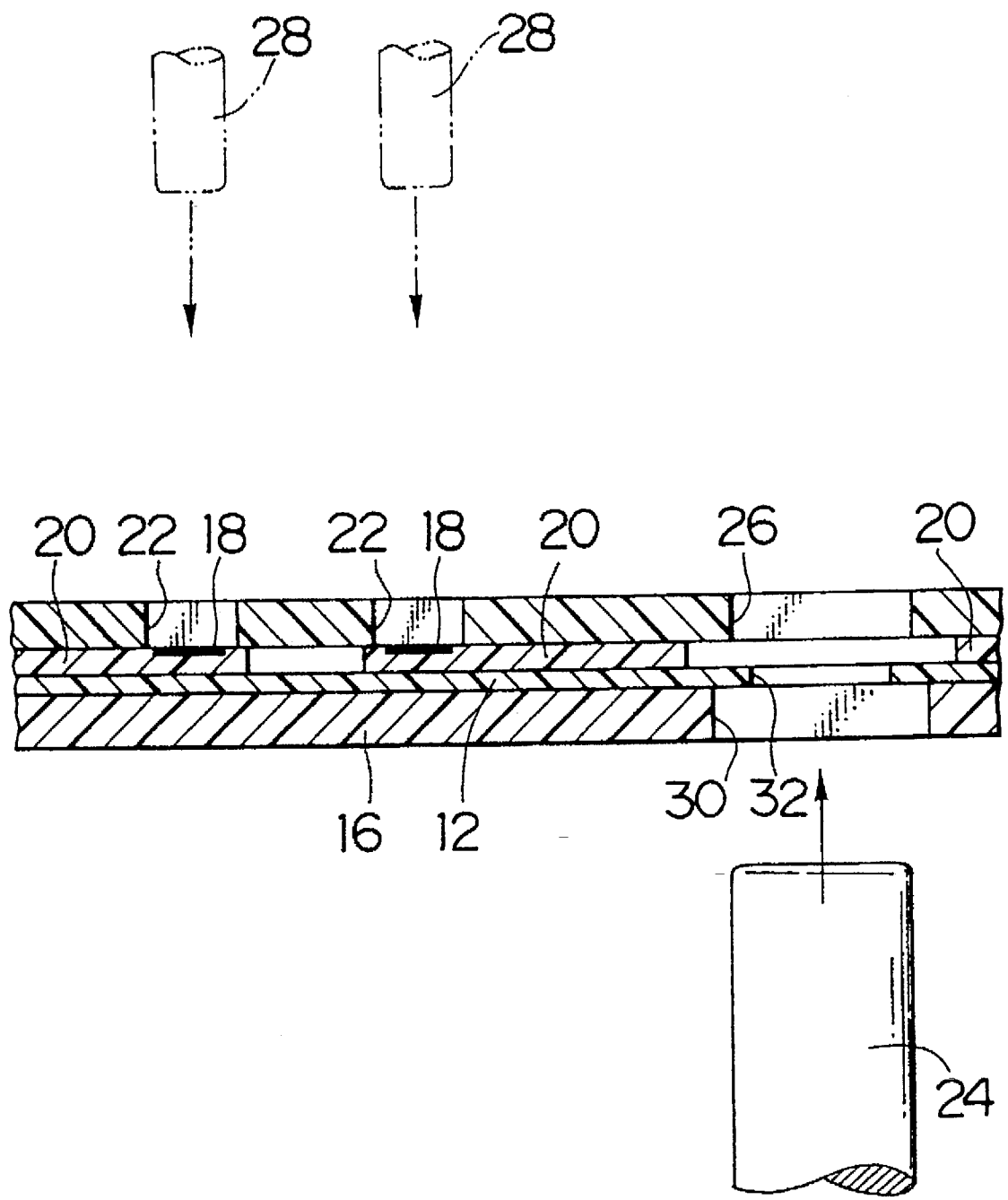

FLEXIBLE PRINTED CIRCUIT

BACKGROUND OF THE INVENTION

1. Field of the Invention

The present invention relates to a flexible printed circuit which is used for an optical instrument such as a camera, VTR integrated with a camera, an electronic still camera and the like, and more particularly to a flexible printed circuit including a positioning hole which is used for positioning the flexible printed circuit at the time of a continuity test.

2. Description of the Related Art

The conventional flexible printed circuit is mainly composed of a base member made of soft material, a wiring pattern made of copper (Cu), etc., and a cover layer. The wiring pattern is printed on the front surface of the base member. After this, the cover layer is adhered to the base member. Further, a reinforcing plate is adhered to the back surface of the base if necessary.

A plurality of test terminals are included in the wiring pattern in addition to a terminal which is to be connected to an IC, etc.. The test terminal is used for a continuity test which is to be carried out before the flexible printed circuit is delivered. Moreover, a plurality of openings are provided in the cover layer so as to expose the test terminals.

At the time of the continuity test, the flexible printed circuit is to be positioned on a stage of the inspecting machine in order that an inspection contacts of the inspecting machine is in contact with the test terminals through the openings of the cover layer. Therefore, the flexible printed circuit has a positioning hole, and a positioning piece of the inspection machine is inserted in the positioning hole in order to position the flexible printed circuit correctly on the stage.

There are two kind of inspection machines which is used for the continuity test, that is, one is the machine which moves one inspection contact towards each of the test terminals with the positioning piece being its reference, and the other is the machine which is provided with the same number of inspection contacts as the test terminals so that all the inspection contacts are made contact with the test terminal at once.

The positioning hole is formed in the flexible printed circuit at the time of punching the external shape of the flexible printed circuit after the cover layer is adhered to the base member.

However, the cover layer is sometimes adhered to the base member in such a manner that the openings does not perfectly correspond to each of the test terminals, and the positioning hole is sometimes formed in a wrong position at the time of punching the external shape. In the case that the flexible printed circuit is made in such a state, the flexible printed circuit is positioned on the basis of the wrongly formed positioning hole. Therefore, there is problem in that the inspection contacts imperfectly come into contact with the test terminals. As a result, the continuity test can not be well carried out.

SUMMARY OF THE INVENTION

The present invention has been developed under the above-described circumstances, and has as its aim the provision of a flexible printed circuit which enables to correctly carry out a continuity test thereof.

To achieve the above-described object, a flexible printed circuit used for an optical instrument such as a camera, VTR integrated with a camera, an electronic still camera and the like, mainly comprises a base member, a wiring pattern including a plurality test terminals for continuity test, and a cover layer. The wiring pattern is printed on a front surface of the base member. The cover layer includes a plurality of openings. The test terminals are exposed from the opening when the cover member is adhered to the base member on which the wiring pattern is printed. A first hole is formed in the cover layer in such a manner to have a predetermined positional relationship with the plurality of the openings. The first hole is used for positioning the flexible circuit at the time of a continuity test. A second hole is formed in the base member in such a manner to have a smaller diameter than that of the first hole. The second hole is located inside the first hole.

According to the present invention, the first hole has substantially the same diameter as that of a positioning piece of means for the continuity test, and the second hole is deformed and the diameter of the second hole is enlarged by an insertion of the positioning piece, so that the positioning piece is inserted in the first hole of the cover layer. As a result, the inspection contact is in contact with the test terminals on the basis of the first hole of the cover layer.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures and wherein:

FIG. 4 is a sectional view illustrating a state that the positioning piece has been inserted into the positioning hole of the flexible printed circuit.

DESCRIPTION OF THE PREFERRED EMBODIMENT

Detailed description will hereunder be given of the preferred embodiment of a flexible printed circuit according to the present invention with reference to the accompanying drawings.

Figure 1:
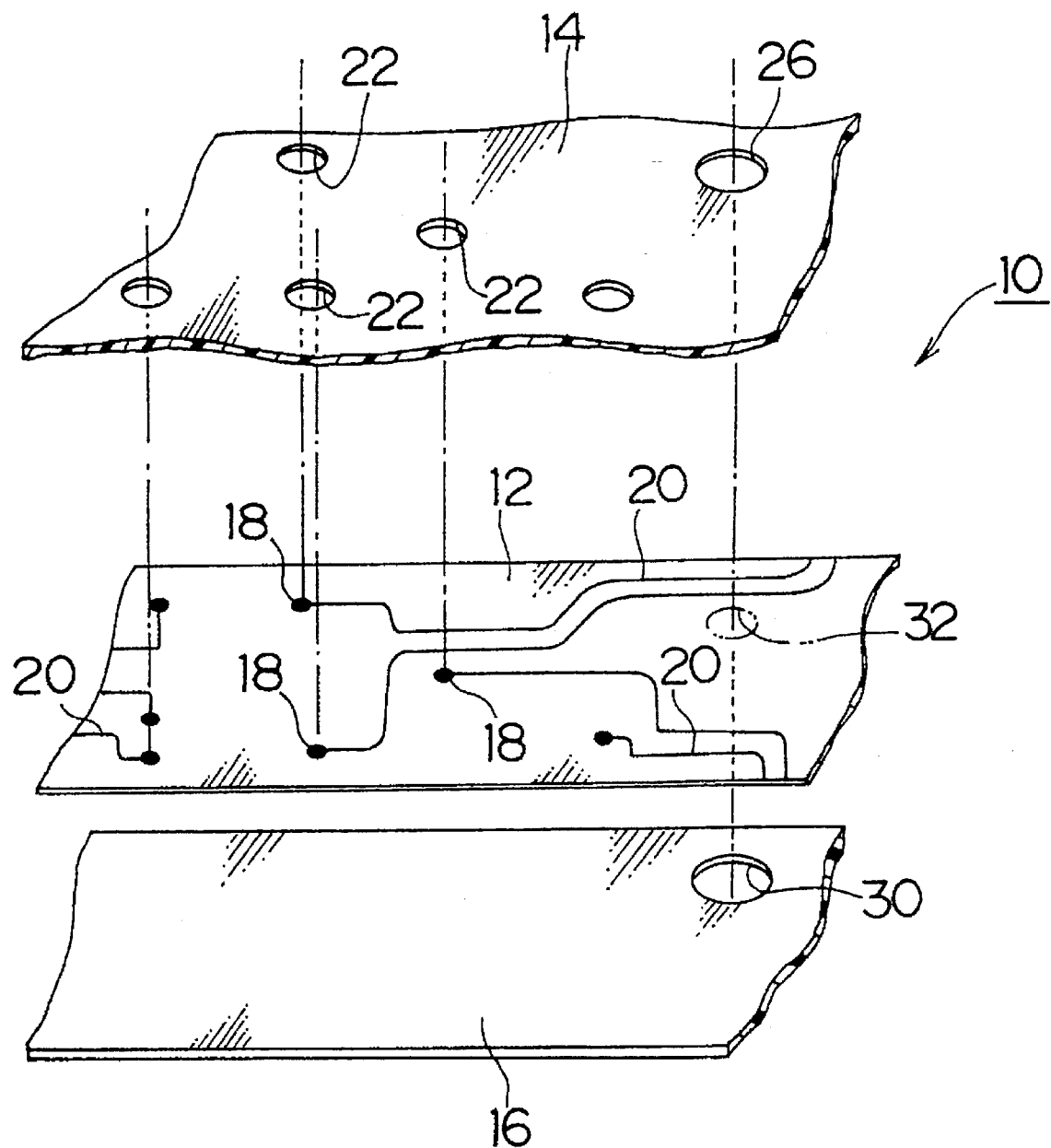
FIG. 1 is a perspective view illustrating a structure of an embodiment of a flexible printed circuit according to the present invention.

FIG. 1 is a perspective view illustrating a structure of an embodiment of a flexible printed circuit according to the present invention. The flexible printed circuit 10 mainly comprises of a base member 12, a cover layer 14 and a reinforcing member 16.

The base member 12 is formed as a thin plate made of a soft material, and a wiring pattern 20 which includes a plurality of test terminals 18 are printed on a front surface of the base member 12.

Figure 2:
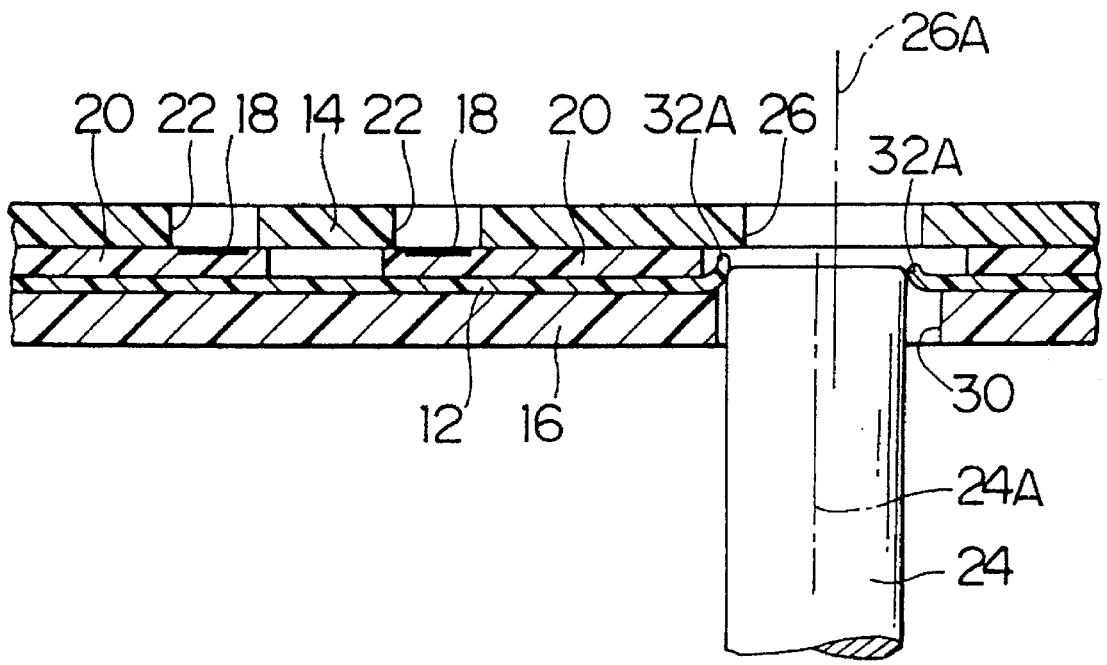
FIG. 2 is a sectional view of a flexible printed circuit.

The cover layer 14 is formed as a sheet. It is harder than the base member 12 because it includes an adhesive layer so as to be adhered to the base member 12. A plurality of openings 22 are formed on the surface of the cover layer 14. The cover layer 14 is adhered to the front surface of the base member 12 in such a manner that the test terminals 18 are exposed from the openings 22. Furthermore, a first hole 26 is formed on the cover layer 14. When a continuity test for the flexible printed circuit 10 is carried out, a positioning piece 24 of an inspection machine is inserted into the first hole 26 in order to position the flexible printed circuit 10 on a stage of the inspection machine. As shown in FIG. 2, the first hole 26 is formed on the cover layer 14 in such a manner to have a predetermined positional relationship with the openings 22. That is, a distance between the first hole 26 and each of the openings 22 is predetermined. The first hole 26 has substantially the same diameter as that of the positioning piece 24 so that the positioning piece 24 can be inserted into the first hole 26. The openings 22 and the first hole 26 are formed on the cover layer 14 before the cover layer 14 is adhered to the base member 12.

The reinforcing member 16 is adhered to the back surface of the base member 12 for reinforcing the base member 12. The reinforcing member 16 is harder than the base member 12 because it includes an adhesive layer so as to adhere to the base member 12. A third hole 30 is formed on the reinforcing member 16, and its diameter is somewhat larger than that of the first hole 26 of the cover layer 14. The third hole 30 is formed on the reinforcing member 16 before the reinforcing member 16 is adhered to the base member 12. When the reinforcing member 16 is adhered to the back surface of the base member 12, the third hole 30 overlaps the first hole 26. Incidentally, the explanation is given of the flexible printed circuit 10 with the reinforcing member 16 in this embodiment. However, the reinforcing member 16 should be adhered to the base member 12 in the case that the reinforcement of the flexible printed circuit is required. Therefore, it is possible to omit the reinforcing member 16.

The base member 12 to which the cover layer 14 and the reinforcing member 16 (if necessary) are respectively adhered is punched so as to form an external shape of the flexible printed circuit 10. At the same time, a second hole 32 (see FIG. 2) is formed on the base member 12 inside the first hole 26 (and third hole 30). A diameter of the second hole 26 is smaller than that of the first hole 26 (the diameter of the positioning piece 24 of the inspection machine).

The above-described first hole 26, second hole 32 and third hole 30 are comprises a positioning hole which is used for poisoning the flexible printed circuit 10 on the stage of the inspection machine at the time of the continuity test.

Figure 3:
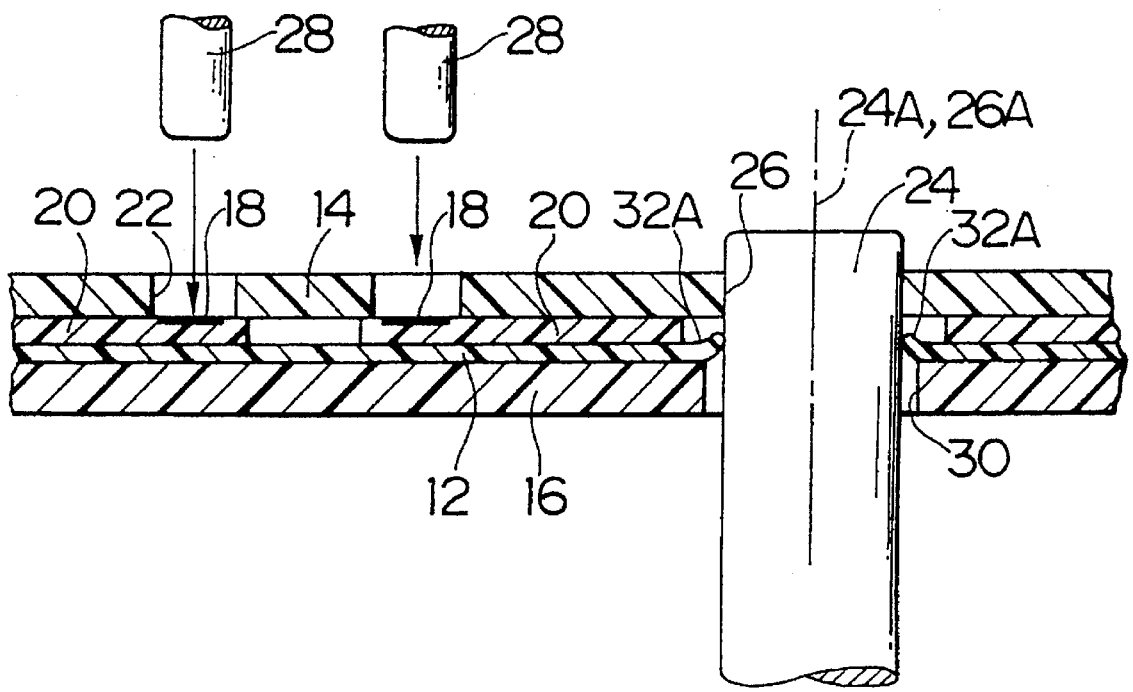
FIG. 3 is a sectional view illustrating a state that a positioning piece of a inspection machine is being inserted into a positioning hole of the flexible print circuit.

Next, explanation will hereunder be given of a function of the positioning hole at the time of the continuity test with reference to FIG. 3 and FIG. 4.

For a finished flexible printed circuit 10, the continuity test is to be carried out. The flexible printed circuit 10 is mounted on the stage of the inspection machine. The positioning piece of the machine is inserted in the positioning hole of the flexible printed circuit 10. The positioning piece is inserted into the third hole 30 of the reinforce member 16. Next, the positioning piece reaches the second hole 32 of the base member 12. Here, the diameter of the second hole 32 is smaller than that of the positioning piece. However, because the base member 12 is made of a soft material, the second hole 32 is deformed by the insertion of the positioning piece 24, so that the diameter of the second hole 32 is enlarged. Therefore, the positioning piece 24 passes through the second hole 32 easily (refer to FIG. 3). Then, the positioning piece 24 is inserted into the first hole 26 of the cover layer 14 as shown in FIG. 4. Accordingly, the flexible printed circuit 10 is positioned on the stage of the inspection machine on the basis of the first hole 26 of the cover layer 14. The distance between the first hole 26 and each of the openings 22 is predetermined. Accordingly, the inspection contacts is perfectly made contact with the test terminals 18 of the flexible printed circuit 10 through the openings 22 on the basis of the first hole 26.

Even if a central axis 24A of the positioning piece 24 does not correspond to a central axis 26A of the first hole 26, the positioning piece 24 is inserted into the first hole 26 without a deformation of the cover layer 12 because the cover layer 14 is harder that the base member 12.

Moreover, even if the cover layer 14 is not correctly adhered to the base member 12, the inspection contact 28 is perfectly made contact with the test terminals 18 because openings 22 is formed to have an appropriate size with taking account of the error of adherence.

Furthermore, even if the second hole 32 is not formed in a wrong position, the second hole 32 is deformed by the insertion of the positioning piece 24 and the diameter of the second hole 32 is enlarged. Therefore, the positioning piece 24 is inserted into the first hole 26.

As a result, the continuity test can be perfectly carried out.

It is possible to form both the first hole 26 and the openings 22 at the same time. Further, the second hole 32 is formed at the time of punching the external shape of the flexible printed circuit. As a result, these holes can be easily formed and making steps is not complected.

As has been described above, according to the flexible printed circuit of the present invention, the positioning hole for the continuity test comprises holes which are formed in each of the composing members of the flexible printed circuit. As a result, there is no imperfect contact between the inspection contact of the inspection machine and the test terminals.

It should be understood, however, that there is no intention to limit the invention to the specific forms disclosed, but on the contrary, the invention is to cover all modifications, alternate constructions and equivalents falling within the spirit and scope of the invention as expressed in the appended claims.

I claim:

1. A flexible printed circuit used for an optical instrument such as a camera, VTR integrated with a camera, an electronic still camera and the like, the flexible printed circuit comprising:

a wiring pattern including a plurality of test terminals for performing a continuity test thereof;

a base member, the wiring pattern being printed on a front surface of the base member;

a cover layer including a plurality of openings, the test terminal being exposed from the opening when the cover member is adhered to the base member on which the wiring pattern is printed;

a first hole formed in the cover layer in such a manner to have a predetermined positional relationship with the plurality of the openings, the first hole being used for positioning the flexible circuit at the time of a continuity test; and a second hole formed in the base member in such a manner to have a smaller diameter than that of the first hole, the second hole being positioned inside the first hole;

wherein the first hole has substantially the same diameter as that of a positioning piece of means for performing the continuity test, and the second hole is deformed and the diameter of the second hole is enlarged by an insertion of the positioning piece, so that the positioning piece is inserted in the first hole of the cover layer.

2. A flexible printed circuit used for an optical instrument such as a camera, VTR integrated with a camera, an electronic still camera and the like according to claim 1, further comprising;

a reinforcing member adhered on a back surface of the base member; and a third hole formed on the reinforcing member, the third hole having a larger diameter than that of the first hole and being positioned outside the second hole.

3. A flexible printed circuit used for an optical instrument such as a camera, VTR integrated with a camera, an electronic still camera and the like according to claim 2, wherein the first hole and the plurality of openings are formed before the cover layer is adhered to the base member, and the second hole is formed after the cover member is adhered to the base member.

4. A method for making a flexible printed circuit which is composed of at least a base member and a cover layer, the method comprising the steps of:

printing a wiring pattern including a plurality of test terminals for performing a continuity test on a front surface of the base member; and forming a plurality of openings for exposing the plurality of test terminals and a first hole which has a predetermined positional relationship with the plurality of openings on the cover layer;

adhering the cover layer on the base member; and forming a second hole in the base member in such a manner that the second hole has a smaller diameter than that of the first hole and is positioned inside the first hole after the cover layer has been adhered to the base member;

wherein the first hole has substantially the same diameter as that of a positioning piece of means for performing the continuity test, and wherein the second hole is deformed and the diameter of the second hole is enlarged by the step of inserting of the positioning piece, so that the positioning piece is inserted in the first hole of the cover layer.

* * * * *